United States Patent
Oganesian (10) Patent No.: US 8,796,800 B2
(45) Date of Patent: Aug. 5, 2014

(54) INTERPOSER PACKAGE FOR CMOS IMAGE SENSOR AND METHOD OF MAKING SAME

(75) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 114 days.

(21) Appl. No.: 13/301,683

(22) Filed: Nov. 21, 2011

(65) Prior Publication Data

US 2013/0127000 A1  May 23, 2013

(51) Int. Cl.
*H01L 31/02* (2006.01)
(52) U.S. Cl.
USPC ................................. 257/433; 257/E31.11
(58) Field of Classification Search
USPC ................................................. 257/431–434
See application file for complete search history.

(56) References Cited

U.S. PATENT DOCUMENTS

| | | | |
|---|---|---|---|
| 6,777,767 B2 | 8/2004 | Badehi | |
| 6,972,480 B2 | 12/2005 | Zilber et al. | |
| 7,033,664 B2 | 4/2006 | Zilber et al. | |
| 7,095,089 B2 * | 8/2006 | Yagi et al. | 257/433 |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,495,341 B2 | 2/2009 | Zilber et al. | |
| 7,642,629 B2 | 1/2010 | Zilber et al. | |
| 7,859,033 B2 | 12/2010 | Brady | |
| 8,111,730 B2 * | 2/2012 | Budd et al. | 372/50.124 |
| 8,265,432 B2 * | 9/2012 | Doany et al. | 385/14 |
| 2004/0251525 A1 | 12/2004 | Zilber | |
| 2005/0104179 A1 | 5/2005 | Zilber | |
| 2005/0205977 A1 | 9/2005 | Zilber | |
| 2006/0154405 A1 * | 7/2006 | Kinsman | 438/125 |
| 2007/0138498 A1 | 6/2007 | Zilber | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0013959 A1 * | 1/2008 | Ishigami | 398/135 |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |
| 2008/0246136 A1 | 10/2008 | Haba et al. | |

(Continued)

FOREIGN PATENT DOCUMENTS

JP  2003-163341  6/2003
KR  10-2011-0036249  4/2011

OTHER PUBLICATIONS

U.S. Appl. No. 13/157,193, filed Jun. 2011, Oganesian.
U.S. Appl. No. 13/157,193, Jun. 9, 2011, Oganesian, Vage.

(Continued)

*Primary Examiner* — Benjamin Sandvik
(74) *Attorney, Agent, or Firm* — DLA Piper LLP (US)

(57) ABSTRACT

An image sensor package and method of manufacture that includes a crystalline handler with conductive elements extending therethrough, an image sensor chip disposed in a cavity of the handler, and a transparent substrate disposed over the cavity and bonded to both the handler and image sensor chip. The transparent substrate includes conductive traces that electrically connect the sensor chip's contact pads to the handler's conductive elements, so that off-chip signaling is provided by the substrate's conductive traces and the handler's conductive elements.

4 Claims, 10 Drawing Sheets

(56) References Cited

U.S. PATENT DOCUMENTS

| | | |
|---|---|---|
| 2009/0032893 A1* | 2/2009 | Weng et al. .................. 257/432 |
| 2009/0115047 A1 | 5/2009 | Haba |
| 2009/0160065 A1 | 6/2009 | Haba |
| 2009/0212381 A1 | 8/2009 | Crisp |
| 2009/0224343 A1* | 9/2009 | Akram ........................ 257/432 |
| 2010/0053407 A1 | 3/2010 | Crisp |
| 2010/0148293 A1* | 6/2010 | Jain et al. .................... 257/434 |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |

OTHER PUBLICATIONS

U.S. Appl. No. 13/157,202, Jun. 9, 2011, Oganesian, Vage.
U.S. Appl. No. 13/157,207, Jun. 9, 2011, Oganesian, Vage.
U.S. Appl. No. 13/186,357, Jul. 19, 2011, Oganesian, Vage.
U.S. Appl. No. 13/225,092, Sep. 2, 2011, Oganesian, Vage.
U.S. Appl. No. 13/312,826, Dec. 6, 2011, Oganesian, Vage.
U.S. Appl. No. 13/343,682, Jan. 4, 2012, Oganesian, Vage.
U.S. Appl. No. 13/427,604, Mar. 22, 2012, Oganesian, Vage.
U.S. Appl. No. 13/356,328, Jan. 23, 2012, Oganesian, Vage.
U.S. Appl. No. 13/468,632, May 10, 2012, Oganesian, Vage.
U.S. Appl. No. 13/559,510, Jul. 26, 2012, Oganesian, Vage.
U.S. Appl. No. 13/423,045, Mar. 16, 2012, Oganesian, Vage.
U.S. Appl. No. 13/609,002, Sep. 10, 2012, Oganesian, Vage.
Notice of Preliminary Rejection corresponding to the related Korean Patent Application No. 2012-0099387 mailed on Sep. 16, 2013.

* cited by examiner

INTERPOSER PACKAGE FOR CMOS IMAGE SENSOR AND METHOD OF MAKING SAME

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

There are different driving forces behind the development of wafer level packaging solutions for image sensors. For example, reduced form factor (i.e. increased density for achieving the highest capacity/volume ratio) overcomes space limitations and enables smaller camera module solutions. Increased electrical performance can be achieved with shorter interconnect lengths, which improves electrical performance and thus device speed, and which strongly reduces chip power consumption. Heterogeneous integration allows for the integration of different functional layers (e.g. the integration of high and low resolution images sensors, the integration of the image sensor with its processor, etc.). Cost reductions per unit packaging can be achieved by packaging only those chips that are known to be good (i.e. only packaging Known Good Dies—KGD).

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g. for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the capital investment for packaging 8 and 12 inch image sensor wafers. For example, the Shellcase WLCSP technique involves packaging the image sensors on the wafer before the wafer is singulated into separate packaged chips, meaning that those chips from each wafer that are defective are still packaged before they can be tested (which drives up the cost). Additionally, standard WLP packages are fan-in packages, in which chip area is equal to the package area, thus limiting the number of I/O connections. Lastly, standard WLP package are bare die packages, which can be complex in test handling, assembly and SMT.

There is a need for an improved package and packaging technique for chips such as image sensor chips that have already been singulated and tested, and provide a low profile packaging solution that is cost effective and reliable (i.e. provides the requisite mechanical support and electrical connectivity).

BRIEF SUMMARY OF THE INVENTION

In one aspect of the present invention, an image sensor package comprises a handler assembly, a sensor chip and a substrate assembly. The handler assembly includes a crystalline handler having opposing first and second surfaces and a cavity formed into the first surface, and a plurality of conductive elements each extending from the first surface, through the crystalline handler, to the second surface. The sensor chip is disposed in the cavity and includes a substrate with front and back opposing surfaces, a plurality of photo detectors formed at the front surface, and a plurality of contact pads formed at the front surface which are electrically coupled to the photo detectors. The substrate assembly includes a substrate having opposing top and bottom surfaces and is optically transparent to at least one range of light wavelengths, and a plurality of electrically conductive traces formed on the bottom surface. The substrate is disposed over the cavity and bonded to the crystalline handler and the sensor chip such that each of the contact pads is electrically connected to at least one of the electrically conductive traces, and each of the electrically conductive traces is electrically connected to at least one of the conductive elements.

Another aspect of the present invention is a method of packaging a sensor chip which includes a substrate with front and back opposing surfaces, a plurality of photo detectors formed at the front surface, and a plurality of contact pads formed at the front surface which are electrically coupled to the photo detectors. The method includes providing a crystalline handler having opposing first and second surfaces, forming a cavity into the first surface, forming a plurality of conductive elements each extending from the first surface, through the crystalline handler, to the second surface, providing a substrate having opposing top and bottom surfaces, wherein the substrate is optically transparent to at least one range of light wavelengths, forming a plurality of electrically conductive traces on the bottom surface, inserting the sensor chip in the cavity, bonding the substrate to the crystalline handler and the sensor chip such that the substrate is disposed over the cavity and each of the contact pads is electrically connected to at least one of the electrically conductive traces and each of the electrically conductive traces is electrically connected to at least one of the conductive elements.

In yet another aspect of the present invention, a method of forming a plurality of image sensor packages includes providing a crystalline handler having opposing first and second surfaces, forming a plurality of cavities into the first surface, forming a plurality of conductive elements each extending from the first surface, through the crystalline handler, to the second surface, providing a substrate having opposing top and bottom surfaces, wherein the substrate is optically transparent to at least one range of light wavelengths, forming a plurality of electrically conductive traces on the bottom surface, providing a plurality of sensor chips (wherein each of the sensor chips includes a substrate with front and back opposing surfaces, a plurality of photo detectors formed at the front surface, and a plurality of contact pads formed at the front surface which are electrically coupled to the photo detectors), inserting the sensor chips in the cavities, bonding the substrate to the crystalline handler and the sensor chips such that the substrate is disposed over the cavities and each of the contact pads is electrically connected to at least one of the electrically conductive traces and each of the electrically conductive traces is electrically connected to at least one of the conductive elements, and cutting the crystalline handler and substrate to form separate packages each including one of the cavities and one of the sensor chips.

Other objects and features of the present invention will become apparent by a review of the specification, claims and appended figures.

DETAILED DESCRIPTION OF THE INVENTION

The present invention is a packaging of microelectronic devices, and image sensors in particular. This invention exploits the modularity of its components to increase yield, reduce cost and improve pass rate. There are three main components to the packaging design, which are formed using wafer level technologies:

1. Handler assembly 2 with preformed electrical circuitry.
2. Optically transparent substrate assembly 4 with preformed electrical circuitry.
3. Singulated image sensor chip 6.

Each component is made separately, kept separately and tested separately. Only known good components are allowed for the integration of the package.

Figure 1A:
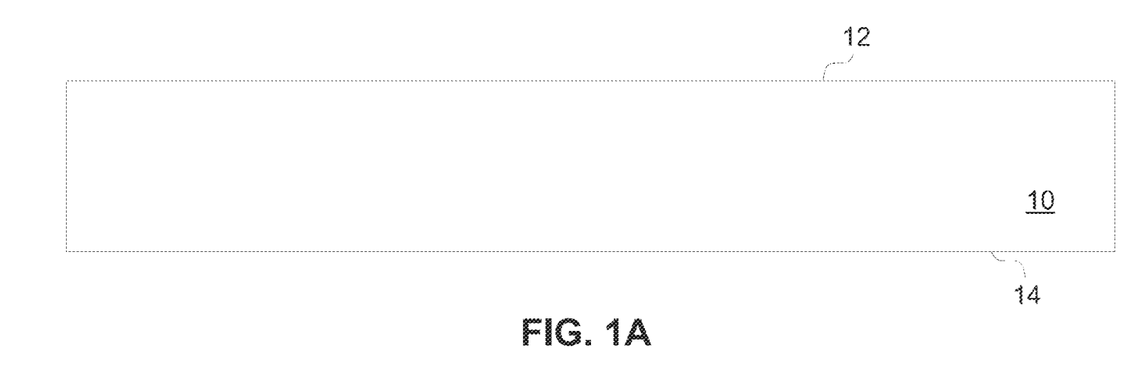
FIGS. 1A-1E are cross sectional side views showing in sequence the steps in forming the handler assembly.
Figure 1B:
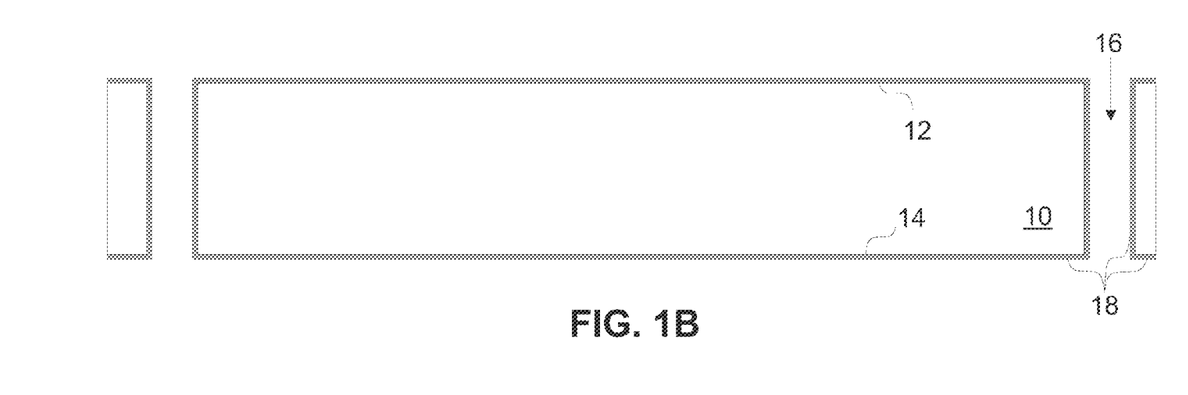

The formation of the handler assembly 2 is illustrated in FIGS. 1A-1E, and begins with a crystalline handler 10, which includes top and bottom surfaces 12 and 14, respectively, as shown in FIG. 1A. Through-holes 16 are formed extending between the top and bottom surfaces 12 and 14. Through-holes 16 can be formed by the use of a laser, by a plasma etching process, by a sandblasting process, by a mechanical milling process, or by any other similar method. Preferably, through-holes 16 are formed by photo-lithography plasma etching, which includes forming a layer of photo resist on the handler 10, patterning the photo resist layer to expose a select portion of handler 10, and then performing a plasma etch process (e.g. BOSCH process, which uses a combination of SF6 and C4F8 gases) to remove the exposed portions of the handler 10 to form the through-holes 16. An isolation (dielectric) layer 18 is next deposited on the sidewalls of through-holes 16 and surfaces 12/14 of handler 10. Dielectric layer 18 can be Si oxide, Si nitride, epoxy based, polyimide, resin, FR4, or any other appropriate dielectric material. Preferably, dielectric layer 18 is at least 0.1 μm in thickness, and is formed using any conventional dielectric layer deposition techniques (which are well known in the art). The resulting structure is shown in FIG. 1B.

Figure 1C:
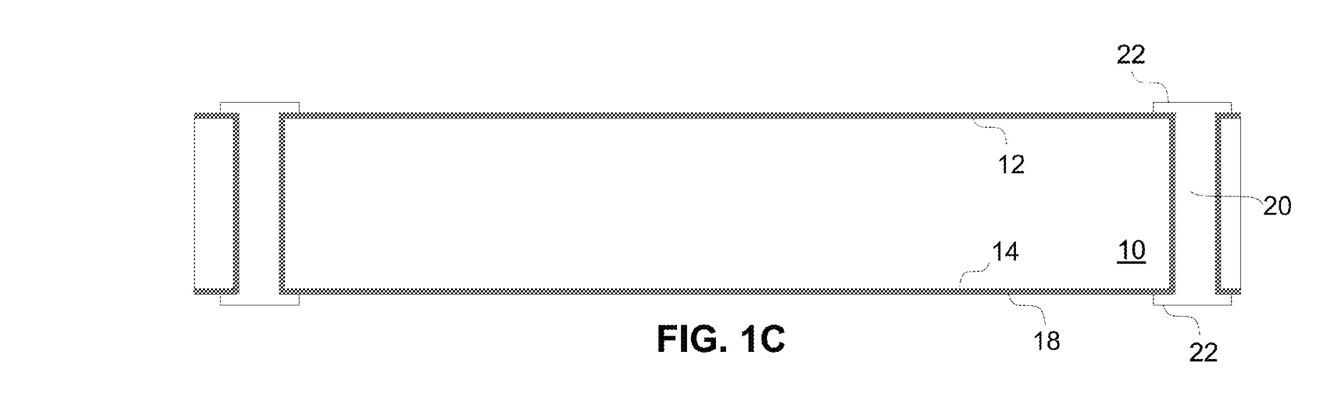

A conductive material (e.g. Cu, Ti/Cu, Ti/Al, Cr/Cu and/or any other well known conductive material(s)) is formed on dielectric layer 18, filling or lining through-holes 16 with the conductive material. A photolithography step is then used to remove portions of the conductive material over portions of top and bottom surfaces 12/14, leaving conductive elements or traces 20 extending through the through-holes 16 and terminating in conductive pads 22 at top and bottom surfaces 12/14. The resulting structure is illustrated in FIG. 1C.

Figure 1D:
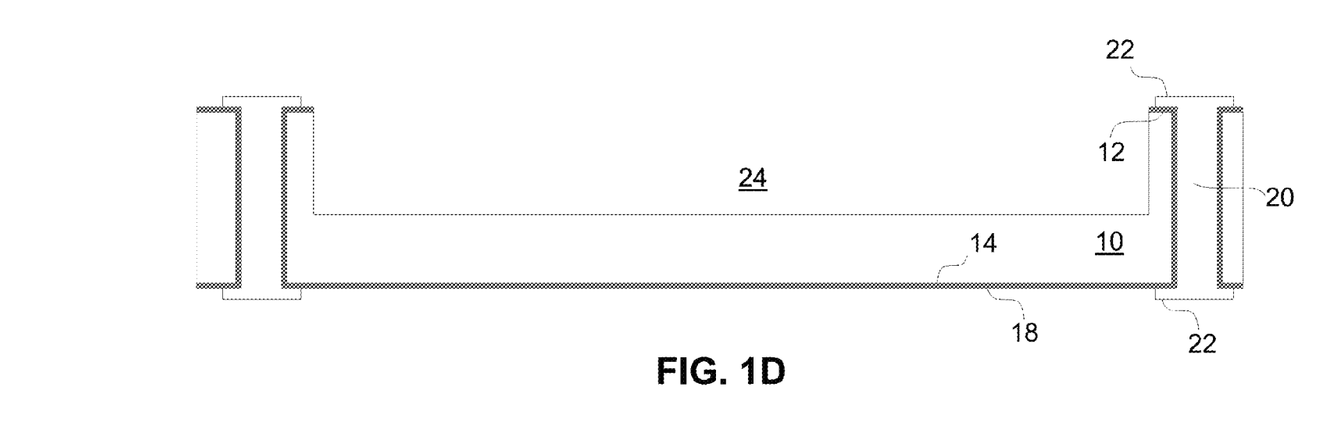

A cavity 24 is next formed into the top surface 12 of handler 10. Cavity 24 can be formed by the use of a laser, by a plasma etching process, by a sandblasting process, by a mechanical milling process, or by any other similar method. Preferably, cavity 24 is formed by performing a photo-lithography plasma etch process that removes a select portion of dielectric layer 18 over top surface 12, and the exposed portion of handler 12. The plasma etch can be anisotropic, tapered, isotropic, or combinations thereof. The resulting structure is illustrated in FIG. 1D.

Figure 1E:
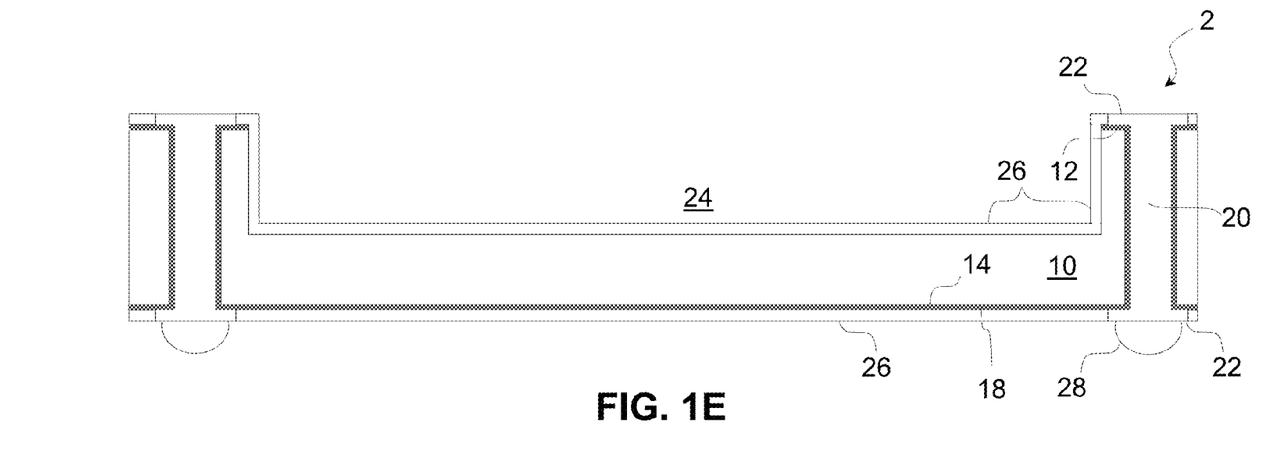

An isolation (dielectric) layer 26 is next deposited on handler 10 (including on surfaces inside cavity 24, following by an etch process that exposes conductive pads 22. Dielectric layer 26 can be Si oxide, Si nitride, epoxy based, polyimide, resin, FR4, or any other appropriate dielectric material, and can be formed using any conventional dielectric layer deposition techniques (which are well known in the art). SMT (surface mount) interconnects 28 are next formed on conductive pads 22. SMT interconnects can be BGA type, and formed using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto contact pads. Alternately SMT interconnects 28 can be conductive metal posts (e.g. copper). The final handler assembly 2 structure is illustrated in FIG. 1E.

Figure 2A:
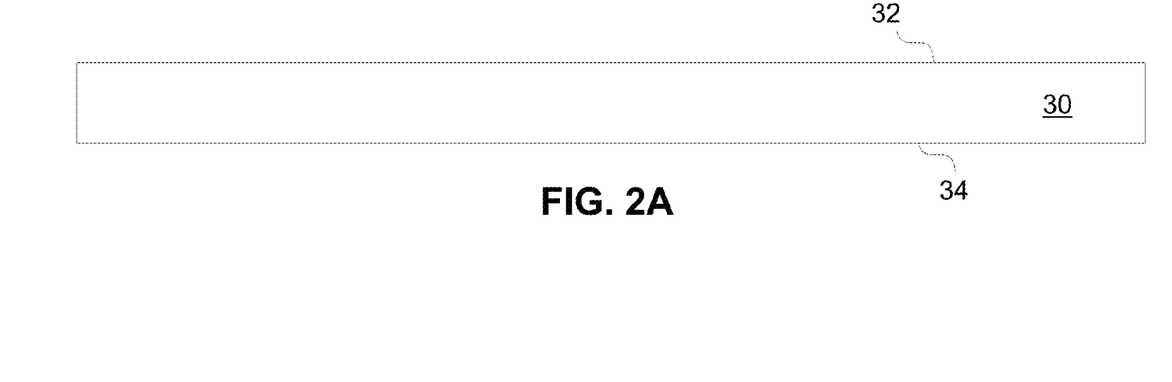
FIGS. 2A-2C are cross sectional side views showing in sequence the steps in forming the transparent substrate assembly.
Figure 2B:
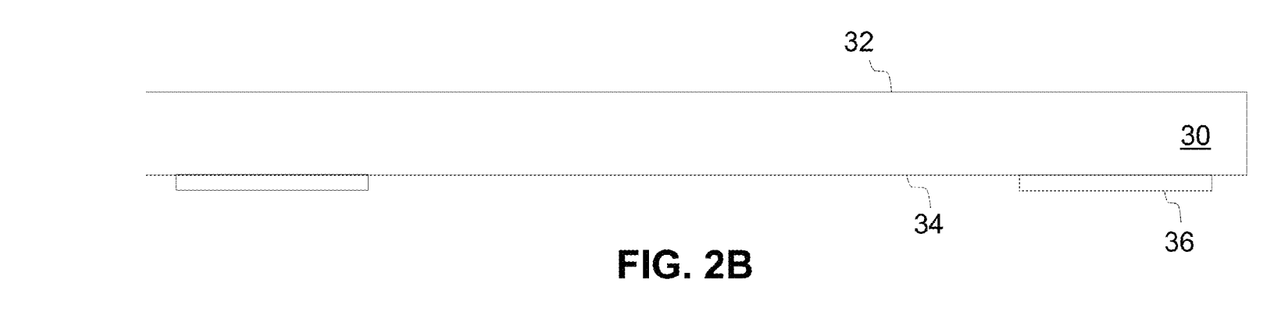
Figure 2C:
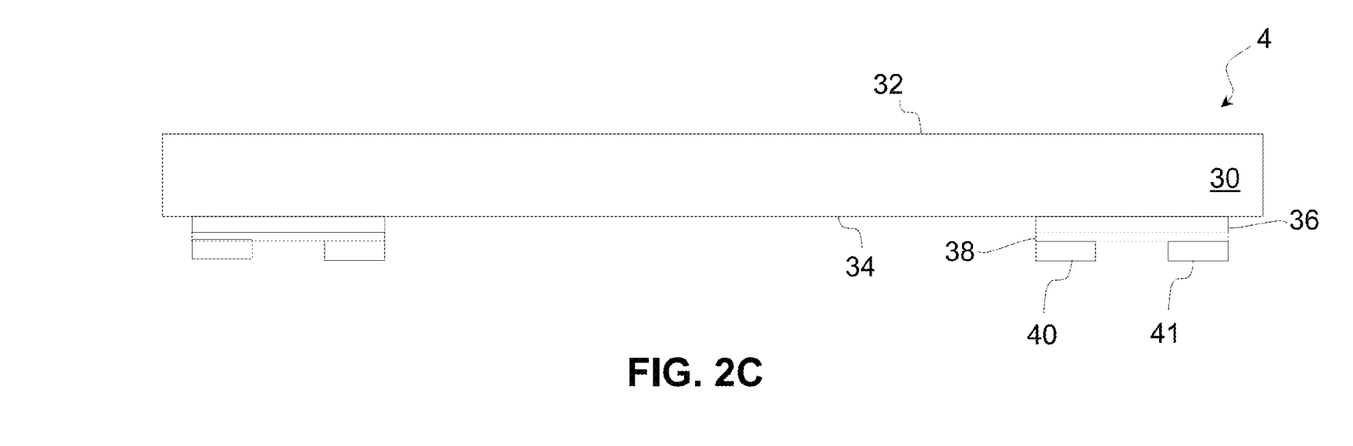

The formation of the optically transparent substrate assembly 4 is illustrated in FIGS. 2A-2C, and begins with an optically transparent substrate 30 having top and bottom surfaces 32 and 34 respectively, as illustrated in FIG. 2A. Substrate 30 can be made of polycrystalline ceramics (e.g. aluminum oxide ceramics, aluminum oxynitride, perovskytes, polycrystalline yttrium aluminum garnet, etc.), single crystalline ceramics, non-crystalline materials (e.g. inorganic glasses and polymers), glass ceramics (e.g. silicate based), etc., and is optically transparent to at least one range of light wavelengths. An isolation (dielectric) layer 36 is deposited on the bottom surface 34, with portions thereof selectively removed using a patterning lithography process. Dielectric layer 36 can be Si oxide, Si nitride, epoxy based, polyimide, resin, FR4, or any other appropriate dielectric material. Preferably, dielectric layer is formed of a compliant material, to prevent the stresses resulting from the difference in CTE of the transparent substrate 30 (e.g. ~3 to $7 \times 10^{-6}$ K$^{-1}$) and the circuitry that will be formed on the dielectric layer 36 (e.g. ~10 to $20 \times 10^{-6}$ K$^{-1}$). Dielectric layer 36 preferably is at least 20 μm in thickness, and formed using a conventional dielectric layer deposition technique (which are well known in the art) followed by a lithography process. The resulting structure is shown in FIG. 2B.

A conductive layer is then formed over the bottom surface 34 (and on dielectric layer 36). This conductive layer can be Cu, Ti/Cu, Cu/Au, Ti/Cu/Au, Al/Ni/Cu, or another other well known conductive material(s). A photolithography step is then performed to selectively remove portions of conductive layer, leaving a plurality of discrete traces 38 of the conductive material disposed on dielectric layer 36. Electrically conductive contact pads 40/41 are then formed on the traces 38 by forming conductive material over the bottom surface 34 (and on traces 38), followed by a photolithography step. The final resulting structure of the optically transparent substrate assembly 4 is shown in FIG. 2C.

Figure 3A:
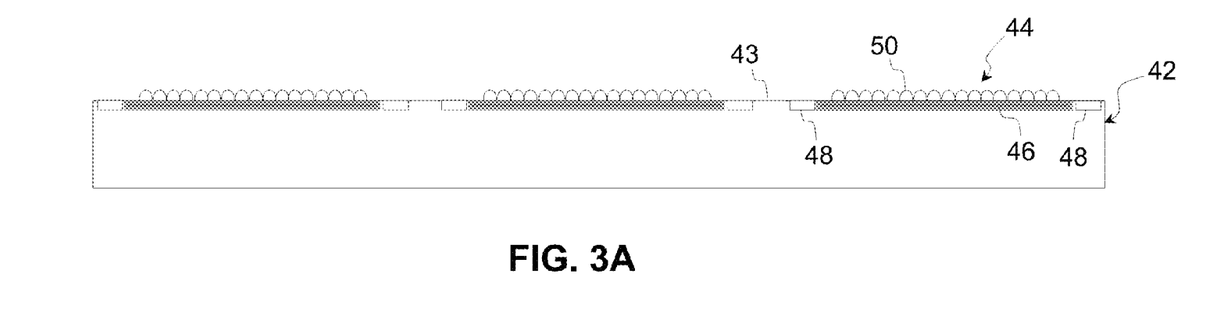
FIGS. 3A-3D are cross sectional side views showing in sequence the steps in singulating the image sensor chips.

The formation of singulated image sensor chip 6 is illustrated in FIGS. 3A-3D, and begins with a wafer 42 having a front surface 43 on which a plurality of sensors 44 have been formed. Each sensor includes a plurality of photo detectors 46 (and supporting circuitry), along with contact pads 48. The photo detectors 46 (and supporting circuitry) and contact pads 48 are formed at the upwardly facing (front) surface of wafer 42, as shown in FIG. 3A. The contact pads 48 are electrically connected to the photo detectors 46 (and/or their supporting circuitry) for providing off chip signaling. Each photo detector 46 converts light energy to a voltage signal. Additional circuitry may be included to amplify the voltage, and/or convert it to digital data. Color filters and/or microlenses 50 can be mounted over the photo detectors 46. Sensors of this type are well known in the art, and not further described herein.

Figure 3B:
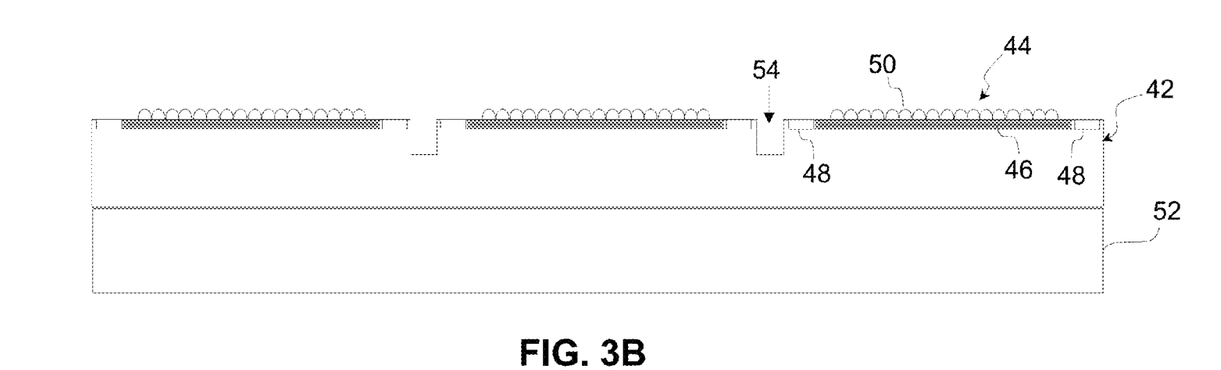

A dicing tape 52 is mounted on the back side of image sensor wafer 42. The dicing tape 52 can be any tape or carrier made of PVC, polyolefin, polyethylene, ceramic or crystalline backing material with an adhesive to hold the dies in place. Dicing tape 52 is generally available in a variety of thicknesses (e.g. from 25 to 1000 μm), with a variety of adhesive strengths, designed for various chip sizes and materials. Partial dicing (pre-cutting) of shallow scribe line areas (streets) is next performed. Partial dicing involves cutting scribe lines (i.e. trenches, channels, grooves, slots, etc.) into the front surface 43 of wafer 42. This cutting procedure can be implemented using a dicing saw, laser or etching process. Preferably, the cutting procedure is implemented using a dicing saw with dicing blade kerf width of 25 to 50 μm, where the depth of the scribe lines extends no further than 30% of thickness of wafer 42. The resulting structure is shown in FIG. 3B.

Figure 3C:
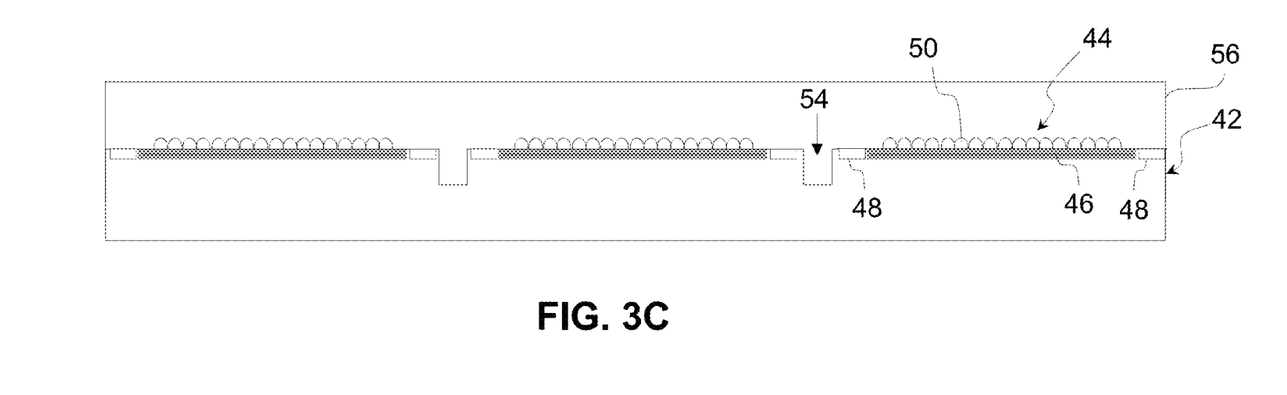
Figure 3D:
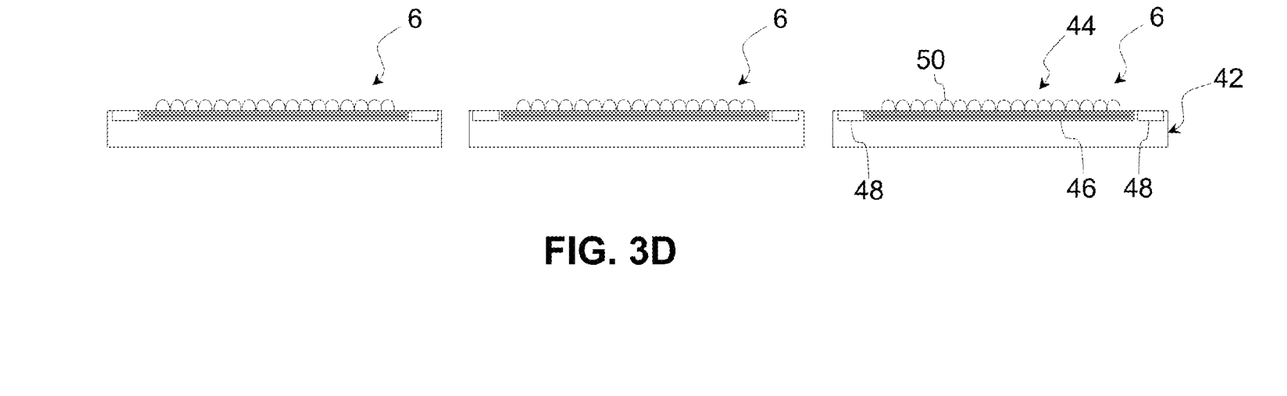

A temporary (sacrificial) protective layer 56 is then mounted on the front side of the wafer 42, and the dicing tape 52 is removed from the back side of wafer 42, as illustrated in FIG. 3C. The temporary protective layer 56 can be made of PVC, polyolefin, polyethylene, ceramic or crystalline backing material, with an adhesive to hold the dies in place after removing of dicing tape. The wafer 42 is then thinned from the back side until die separation has been completed (i.e. the sensors 44 are separated so that each is on its own die), preferably using wafer grinding and/or a silicon etch process. The protective layer 56 is then removed, leaving the final image sensor chips 6 as illustrated in FIG. 3D. The sensors 44 are then individually tested, so that only known good sensor chips 6 are packaged. Alternately, the sensors 44 can be tested before the sensor chips 6 are removed from the protective layer 56, where only known good sensor chips 6 are removed from the protective layer 56 and placed in trays for future assembly.

Figure 4:
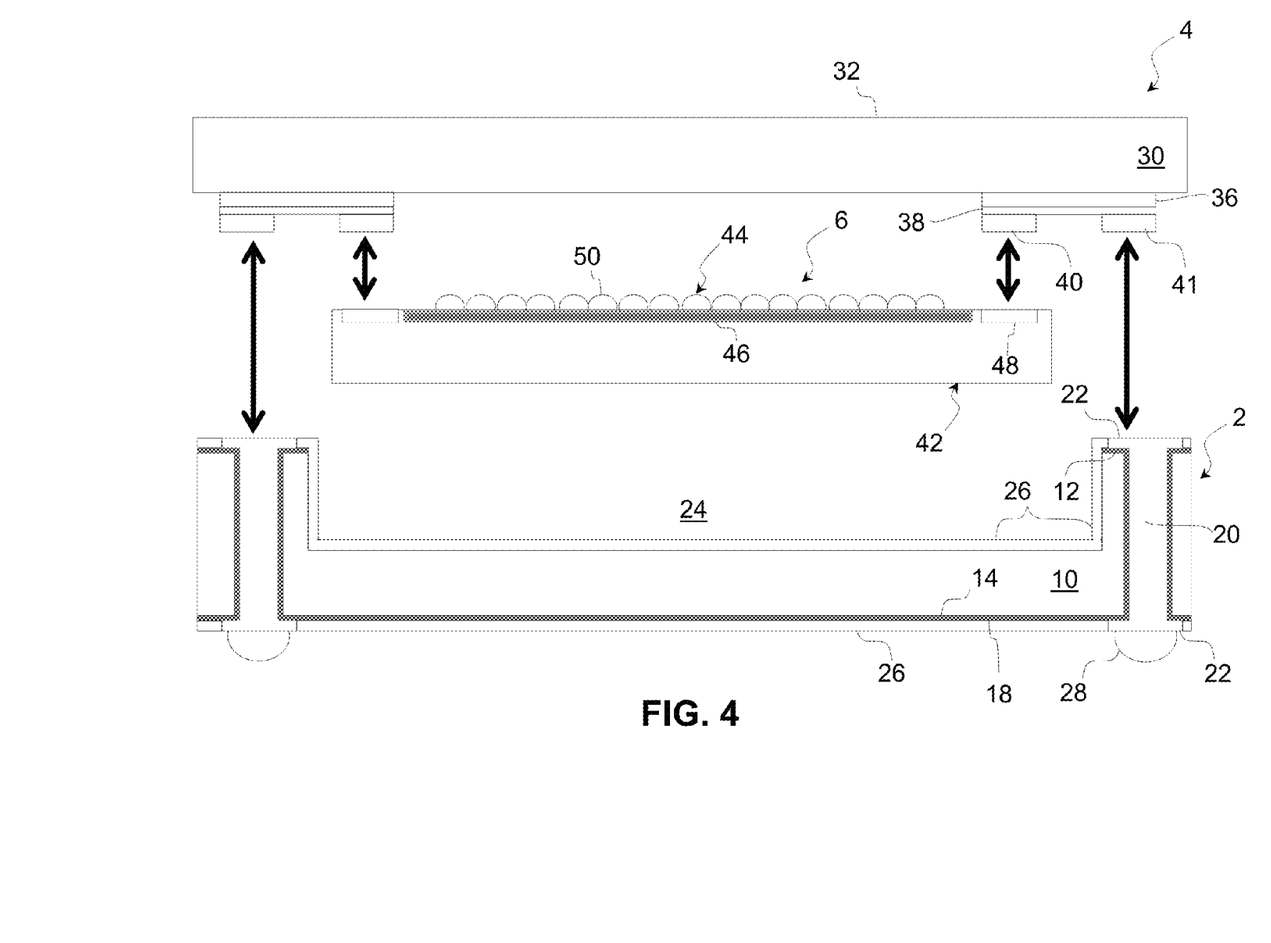
FIG. 4 is a cross sectional side view showing the integration of the handler assembly, the transparent substrate assembly and the image sensor chip.

The separately formed handler assembly 2, transparent substrate assembly 4 and image sensor chip 6 are then integrated together as illustrated in FIG. 4, whereby sensor chip 6 is disposed in cavity 24. Specifically, image sensor chip 6 is bonded to the transparent substrate assembly 4 such that the contact pads 48 of the image sensor chip 6 are in electrical contact with the conductive pads 40 of the transparent substrate assembly 4. Transparent substrate assembly 4 is bonded to the handler assembly 2 such that conductive pads 41 of the transparent substrate assembly 4 are in electrical contact with the conductive pads 22 of handler assembly 2. The bonding of image sensor chip 6 to the optically transparent substrate assembly 4 can be performed first, followed by the bonding of those bonded components to the handler assembly 2. Alternately, the image sensor chip 6 can be assembled into the cavity 24 of the handler assembly 2, followed by the attachment of the transparent substrate assembly 4. Bonding can include conductive paste between conductive pads 40/41 and the corresponding conductive pads 22 or corresponding contact pads 48, or any other well known metal to metal joining technique. An optional layer of adhesive can be utilized between the bottom surface of cavity 24 and the back surface of wafer 42. The final assembled structure is illustrated in FIG. 5.

Figure 6A:
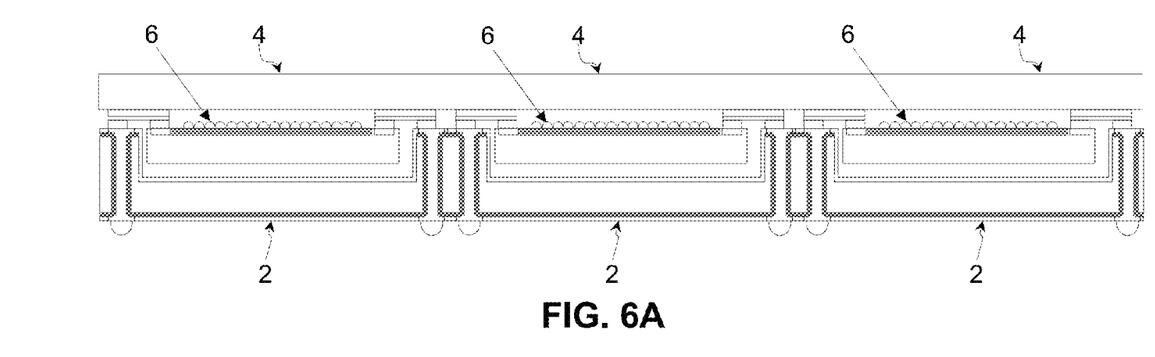
FIG. 6A is a cross sectional side view the integrated handler assemblies, transparent substrate assemblies and image sensor chips before singulation.
Figure 6B:
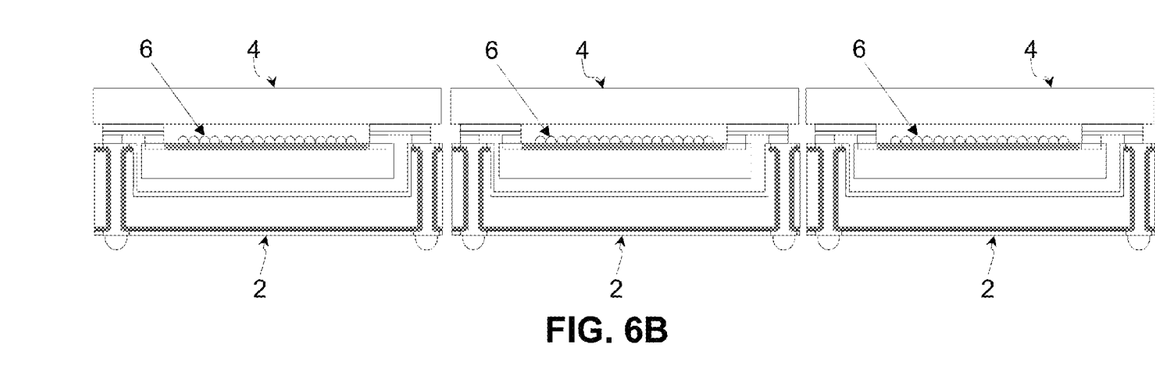
FIG. 6B is a cross sectional side view the integrated handler assemblies, transparent substrate assemblies and image sensor chips after singulation.

Preferably, multiple handler assemblies 2 are formed on a single crystalline handler 10, and multiple transparent substrate assemblies 4 are formed on a single transparent substrate 30. The above described integration can therefore be performed before handler 10 and substrate 30 are singulated into individual handler assemblies 2 and transparent substrate assemblies 4, or afterward. If integration is performed before singulation, then the pre-singulation structure is shown in FIG. 6A, and the post singulation structure is shown in FIG. 6B.

Figure 5:
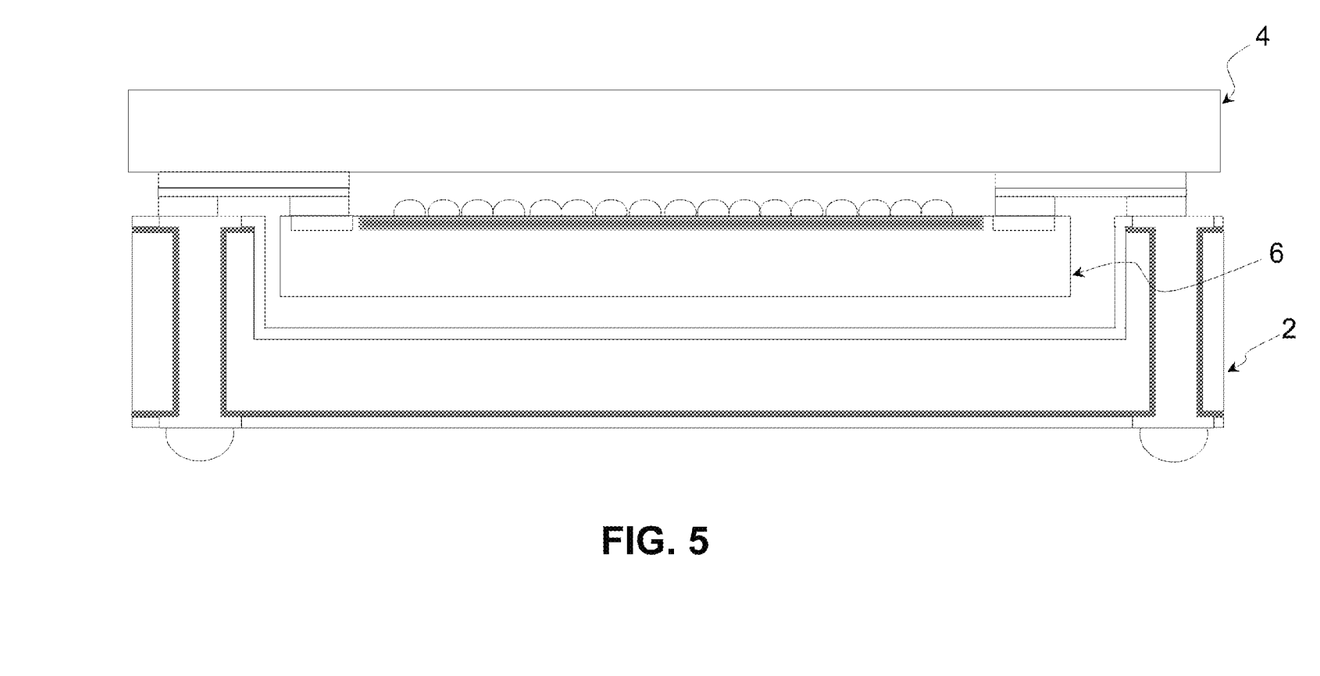
FIG. 5 is a cross sectional side view showing the integrated handler assembly, transparent substrate assembly and image sensor chip.

The transparent substrate assembly 4 and handler assembly 2 of the assembled packaging structure of FIG. 5 provide protection for sensor chip 6, and provide fan-out array electrical connections. In operation, sensor 44 receives the incoming light through the transparent substrate 30. Off chip conductivity is provided from each of the contact pads 48 on the image sensor chip 6, through the corresponding conductive pad 40, the corresponding conductive trace 38, the corresponding conductive pad 41, the corresponding conductive trace 20, and finally the corresponding surface mount 28. Each of the three major components (handler assembly 2, transparent substrate assembly 4, and image sensor 6) are fabricated separately for ease of manufacture and to ensure any defective components can be discarded before being integrated (i.e. only known good components make it to final integration), thus increasing yield and pass rates, and decreasing costs.

Figure 7:
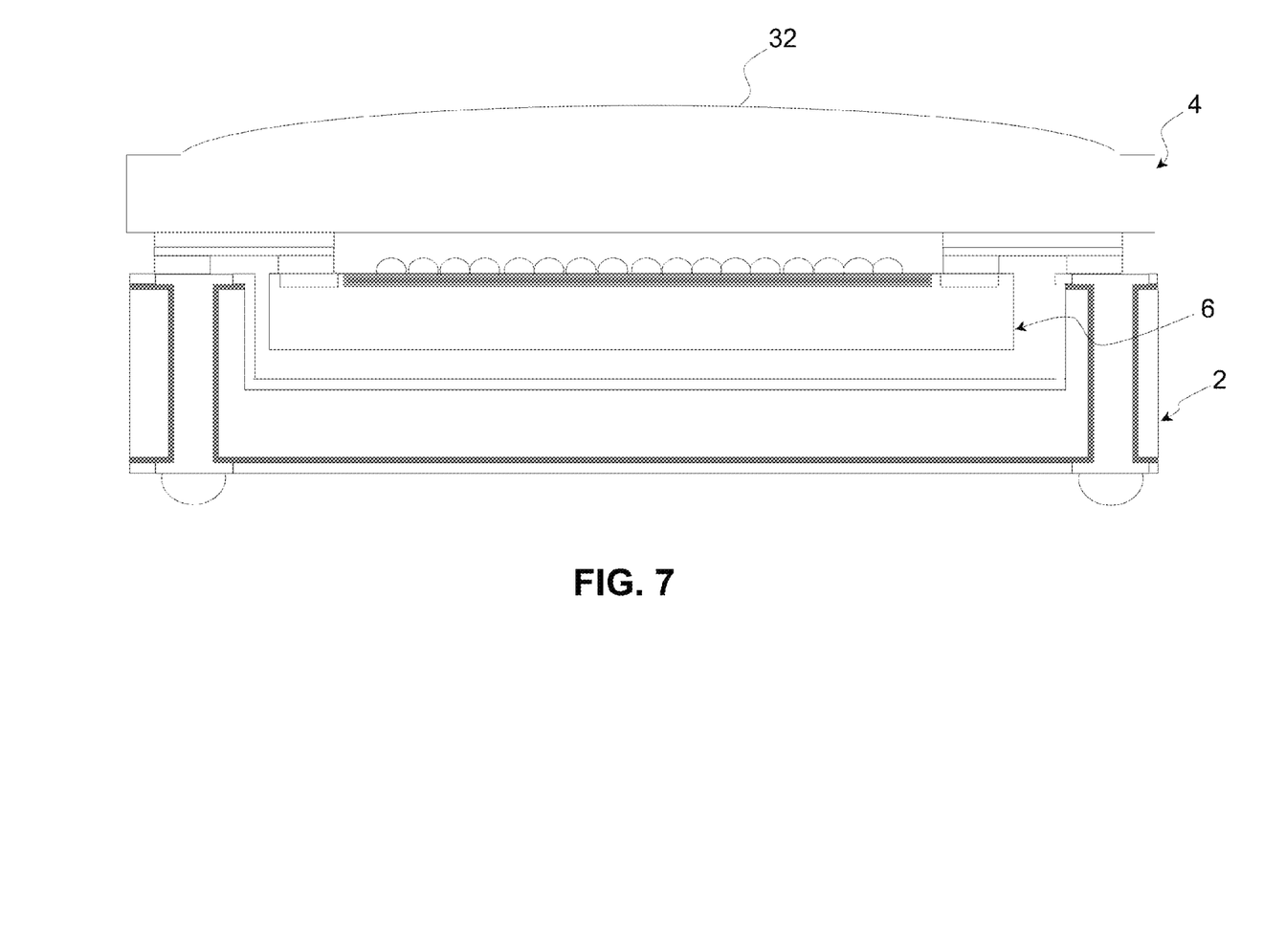
FIG. 7 is a cross sectional side view of an alternate embodiment of the integrated handler assembly, the transparent substrate assembly and the image sensor chip, where the transparent substrate assembly includes an integrally formed lens at its top surface.

FIG. 7 illustrates an alternate embodiment, in which the top surface 32 of transparent substrate 30 is non-planar such that it acts as a lens for the light entering substrate 30. The distance between the lens substrate 30 and the active surface of the sensor 44 is fixed, and can be optimized during assembly by changing the thickness of dielectric material layer 36, conductive traces 38 and/or conductive pads 40/41.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the image sensor packaging of the present invention. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to"

(no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
   a handler assembly that includes:
      a conductive crystalline handler having opposing first and second surfaces, wherein the handler includes a cavity formed into the first surface, and
      a plurality of conductive elements each extending from the first surface, through the crystalline handler, to the second surface, wherein for each of the conductive elements, a dielectric layer is disposed between the conductive element and the conductive crystalline handler;
   a sensor chip disposed in the cavity, wherein the sensor chip includes:
      a substrate with front and back opposing surfaces,
      a plurality of photo detectors formed at the front surface, and
      a plurality of contact pads formed at the front surface which are electrically coupled to the photo detectors; and
   a substrate assembly that includes:
      a substrate having opposing top and bottom surfaces, wherein the substrate is optically transparent to at least one range of light wavelengths, and
      a plurality of electrically conductive traces formed on the bottom surface and insulated from the substrate by a compliant dielectric material that is disposed only between the plurality of electrically conductive traces and the bottom surface;
   wherein the substrate is disposed over the cavity and bonded to the crystalline handler and the sensor chip such that:
      each of the contact pads is electrically connected to at least one of the electrically conductive traces by a first conductive pad disposed between and electrically connecting the contact pad and the at least one electrically conductive traces, and
      each of the electrically conductive traces is electrically connected to at least one of the conductive elements by a second conductive pad disposed between and electrically connecting the electrically conductive trace and the at least one conductive element.

2. The image sensor package of claim 1, further comprising:
   a plurality of surface mount interconnects each disposed over the second surface of the crystalline handler, and each electrically connected to one of the conductive elements.

3. The image sensor package of claim 1, wherein the sensor chip further comprises:
   a plurality of color filters and microlenses mounted over the photo detectors.

4. The image sensor package of claim 1, wherein a portion of the substrate top surface disposed over the photo detectors is non-planar.

* * * * *